(12) United States Patent
Yang et al.

(10) Patent No.: US 8,921,218 B2
(45) Date of Patent: Dec. 30, 2014

(54) METAL GATE FINFET DEVICE AND METHOD OF FABRICATING THEREOF

(75) Inventors: Yu-Lin Yang, Baoshan Township, Hsinchu County (TW); Tsu-Hsiu Perng, Hsin-Chu (TW); Chih Chieh Yeh, Taipei (TW); Li-Shyue Lai, Jhube (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 140 days.

(21) Appl. No.: 13/475,297

(22) Filed: May 18, 2012

(65) Prior Publication Data

US 2013/0307088 A1  Nov. 21, 2013

(51) Int. Cl.
*H01L 21/283* (2006.01)
*H01L 29/78* (2006.01)

(52) U.S. Cl.
USPC ........... 438/592; 438/157; 438/209; 438/283; 438/299; 438/689; 257/288; 257/347; 257/365

(58) Field of Classification Search
USPC .......... 257/288, 347, 365; 438/157, 209, 283, 438/299, 689
See application file for complete search history.

(56) References Cited

U.S. PATENT DOCUMENTS

2012/0032240 A1* 2/2012 Mayuzumi .................... 257/288
2013/0043545 A1* 2/2013 Lee et al. ...................... 257/411

* cited by examiner

*Primary Examiner* — Matthew W Such
*Assistant Examiner* — David Spalla
(74) *Attorney, Agent, or Firm* — Haynes and Boone, LLP (57) ABSTRACT

A method and device including a substrate having a fin. A metal gate structure is formed on the fin. The metal gate structure includes a stress metal layer formed on the fin such that the stress metal layer extends to a first height from an STI feature, the first height being greater than the fin height. A conduction metal layer is formed on the stress metal layer.

18 Claims, 13 Drawing Sheets

METAL GATE FINFET DEVICE AND METHOD OF FABRICATING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented to realize the smaller feature size is the use of multigate devices such as fin field effect transistor (finFET) devices. FinFETs are so called because a gate is formed on and around a "fin" that extends from the substrate. As the term is implemented in the present disclosure, a finFET device is any fin-based, multigate transistor. FinFET devices may allow for shrinking the gate width of device while providing a gate on the sides and/or top of the fin including the channel region. Another advancement implemented as technology nodes shrink, in some IC designs, has been the replacement of the typically polysilicon gate electrode with a metal gate electrode to improve device performance with the decreased feature sizes. One method of forming the metal gate electrode is a "gate last" or "replacement gate" methodology where a dummy gate, typically polysilicon is replaced by a metal gate. Providing the metal gate later in the process can avoid problems of the stability of the work function metal during processing.

However, challenges in providing an appropriate stress and/or gate resistance in devices such as metal gate finFETs. For example, low stress on the gate and/or high gate resistance can cause a degradation of performance of device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4a-13b illustrate cross sectional views of an embodiment of a finFET device corresponding to one or more steps of the method of FIG. 3. FIGS. 4a, 5a, 6a, 7a, 8a, 9a, 10a, 11a, 12a, and 13a are provided along cross-sectional view substantially similar to section AA of FIG. 1. FIGS. 4b, 5b, 6b, 7b, 8b, 9b, 10b, 11b, 12b, and 13b are provided along cross-sectional view substantially similar to section BB of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configuration. One of ordinary skill may recognize other embodiments of semiconductor devices that may benefit from aspects of the present disclosure.

Figure 1:
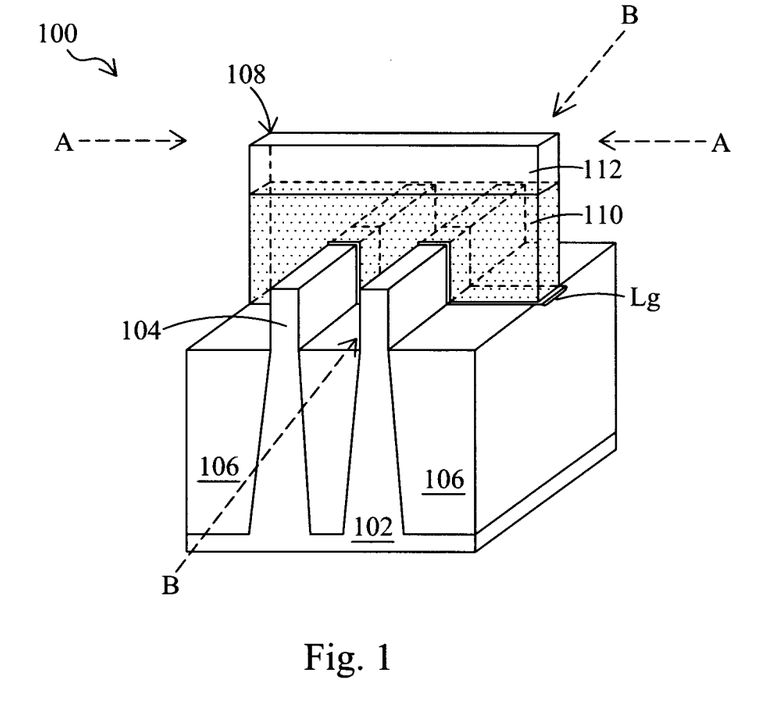
FIG. 1 is perspective view of an embodiment of a finFET device according to one or more aspects of the present disclosure.

Illustrated in FIG. 1 is a finFET device 100. The finFET device 100 includes one or more fin-based, multigate field effect transistors. The finFET device 100 includes a substrate 102, a fin-element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulative layers formed on a semiconductor substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features.

The fin-element 104, like the substrate 102, may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 102 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into the silicon layer, leaving an extending fin. The recesses may be etched using reactive ion etch (RIE) and/or other suitable processes. Numerous other embodiments of methods to form the fins 104 on the substrate 102 may be suitable.

Each of the plurality of fins 104 include a source/drain region where a source or drain feature is formed in, on, and/or surrounding the fin 104. A channel region of a transistor is disposed in the fin 104 underlies the gate structure 108.

The isolation regions 106 may be shallow trench isolation (STI) features. Alternatively, field oxide, a LOCOS feature, and/or other suitable isolation features may be implemented on the substrate 102. The isolation regions 106 may be formed of silicon oxide, silicon nitride, silicon oxynitride, fluoride-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polish (CMP). However, other embodiments are possible. The isolation regions 106 may include a multi-layer structure, for example, having one or more liner layers.

The gate structure 108 includes a first metal layer 110 and a second metal layer 112. The first metal layer 110 may be a stress metal layer. The second metal layer 112 may be a conduction metal layer. The first metal layer 110 is filled over the fin height, such that it extends on and above a top surface of the fin 104. This is described in further detail with respect to FIG. 2. The first metal layer 110 may provide for a stress to the gate. The second metal layer 112 may provide for a lower gate resistance (e.g., lower than a gate structure having exclusively a composition of the first metal layer 110).

Figure 2:
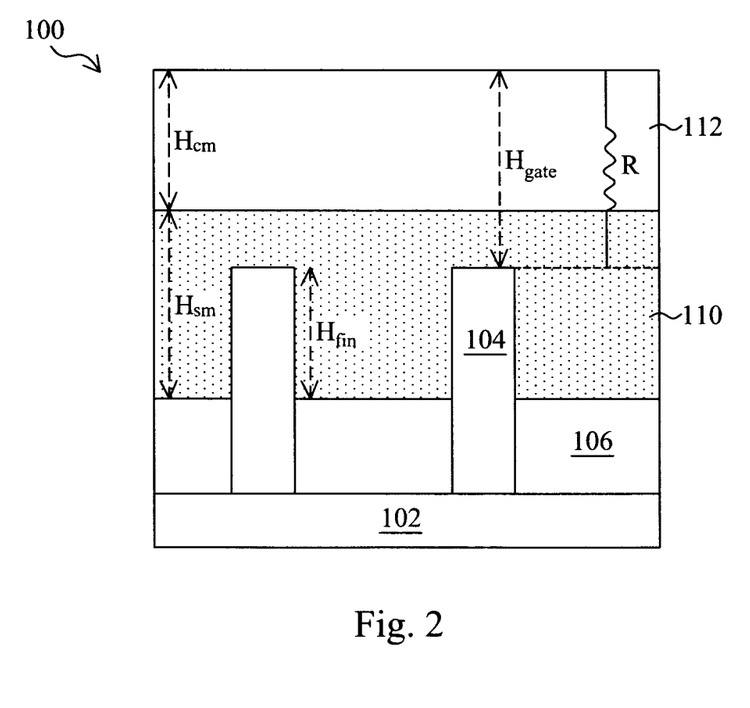
FIG. 2 is a cross-sectional view of an embodiment of a finFET device according to one or more aspects of the present disclosure.

The resistance of the gate of the device 100 may be represented as $$R = 1/(L_g w)[\rho_{sm}(H_{sm} - H_{fin}) + \rho_{cm} + H_{cm}]$$

where $\rho_{sm} \gg \rho_{cm}$. $\rho_{sm}$ is the resistivity of the first metal layer 110. $\rho_{cm}$ is the resistivity of the second metal layer 112. $L_g$ is the length of the gate as illustrated in FIG. 1. $H_{sm}$, $H_{fin}$, $H_{cm}$ are detailed below with reference to FIG. 2.

Exemplary compositions for the first metal layer 110 include W, TiN, TaN, WN, Re, Ir, Ru, Mo, combinations thereof, and/or other suitable compositions. The first metal layer 110 may be formed using chemical vapor deposition, atomic layer deposition, and/or other suitable process. In an embodiment, the first metal layer 110 includes W having a Young's modulus of approximately 400-410 GPa, deposited, for example, by CVD. In an embodiment, the first metal layer 110 includes TiN having a Young's modulus of approximately 251-550 GPa, deposited, for example, by atomic layer deposition (ALD). In an embodiment, the first metal layer 110 includes TaN deposited by ALD. In an embodiment, the first metal layer 110 includes WN deposited by CVD. In other embodiments, the first metal layer 110 includes Re having a Young's modulus of approximately 463 GPa; Ir having a Young's modulus of approximately 528 GPa; Ru having a Young's modulus of approximately 447 GPa; or Mo having a Young's modulus of approximately 329 GPa.

Exemplary compositions for the second metal layer 112 include Al, Cu, CO, Ni, combinations thereof, and/or other suitable compositions. The second metal layer 112 may be formed using physical vapor deposition and/or other suitable process. In an embodiment, the second metal layer 112 includes Al having a resistivity of $2.7\text{E}10^{-8}$ $\Omega$m, deposited, for example, by physical vapor deposition (PVD). In an embodiment, the second metal layer 112 includes Cu having a resistivity of $1.72*10^{-8}$ $\Omega$m, deposited, for example, by PVD. In an embodiment, the second metal layer 112 includes Co having a resistivity of $6*10^{-8}$ $\Omega$m, deposited, for example, by PVD. In an embodiment, the second metal layer 112 includes Ni having a resistivity of $7.2*10^{-8}$ $\Omega$m, deposited, for example, by PVD.

The gate structure 108 may further include an interfacial layer and/or gate dielectric layer. The interfacial layer may include a dielectric material such as silicon oxide layer ($SiO_2$) or silicon oxynitride (SiON). The interfacial layer may be formed by chemical oxidation, thermal oxidation, atomic layer deposition (ALD), chemical vapor deposition (CVD), and/or other suitable method. The gate dielectric layer may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by atomic layer deposition (ALD), oxidation, and/or other suitable methods. The dielectric layer(s) may underlie the first and/or second metal layers 110, 112. In an embodiment, the first metal layer 110 is formed directly on the gate dielectric layer.

Referring now to FIGS. 1 and 2, the gate structure 108 is described in further detail. FIG. 2 provides a cross-sectional view of the device 100 at A-A. The gate structure 108 has a gate height ($H_{gate}$) extending from a top surface of the gate structure (e.g., top of the second metal 112) to the top surface of the fin 104. The $H_{gate}$ may be between approximately 20 nanometers (nm) and approximately 60 nm, by way of example. The fin 104 may extend a height $H_{fin}$ above the isolation region 106. The $H_a$ may be between approximately 10 nm and approximately 40 nm, by way of example. The first metal layer 110 (e.g., stress metal) includes a height $H_{sm}$. $H_{sm}$ is greater than $H_{fin}$. The $H_{sm}$ may be between approximately 20 nm and approximately 70 nm, by way of example.

More generally, the device 100 may provide the relationship:

$$H_{fin} < H_{sm} < (H_{fin} + (H_{gate}/2))$$

or $H_{fin}$ may be less than $H_{sm}$ (height of the first metal); $H_{sm}$ (height of the first metal) is less than $H_{fin}$+half of $H_{gate}$, as illustrated in FIG. 2.

Thus, the device 100 is illustrative of a finFET device (e.g., semiconductor device including one or more fin-based transistors) having a first, stress metal layer and a second, conduction metal layer included in its gate structure. This may provide for a stronger stress than a planar transistor. The device 100 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
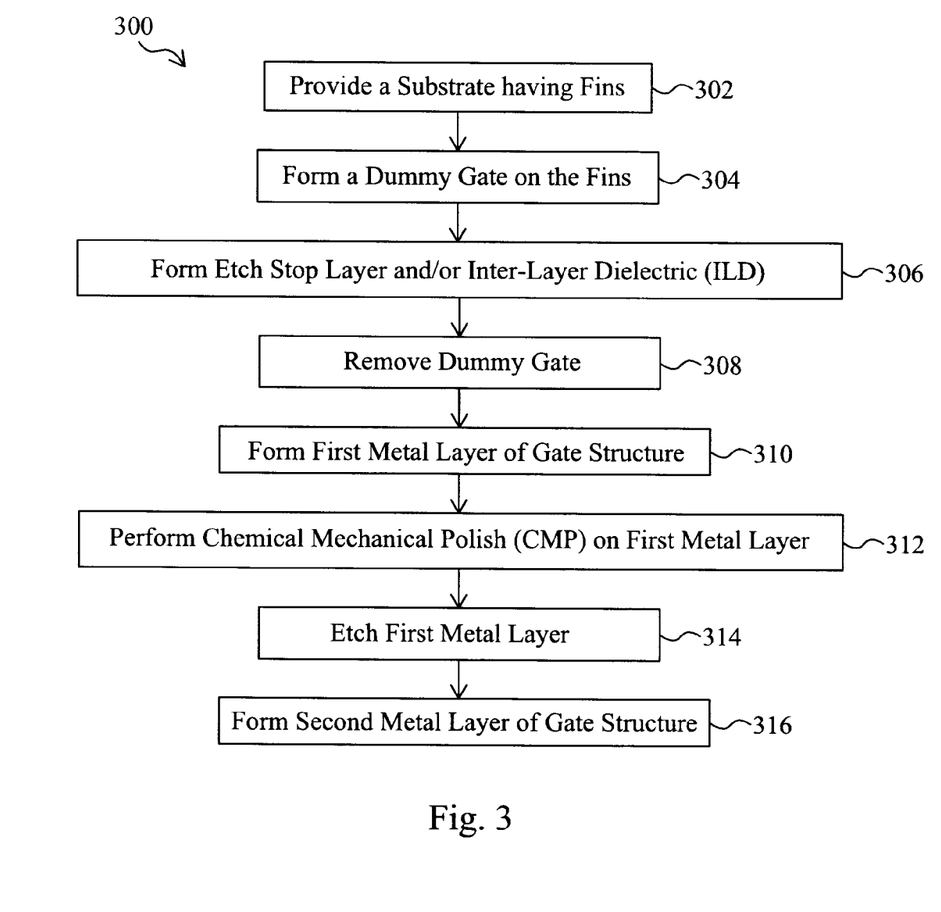
FIG. 3 is a flow chart of a method of fabricating a finFET device according to one or more aspects of the present disclosure.

Referring now to FIG. 3, illustrated is a method 300 of fabricating a semiconductor device including a finFET device. The method 300 may be used to implement a metal gate structure on a fin-based semiconductor device. For example, the method 300 may be used to fabricate the device 100, described above with reference to FIGS. 1 and 2. Thus, one or more aspects discussed above may also apply to the method 300. Additionally, FIGS. 4-12 are cross-sectional views of an exemplary device 400 fabricating according to one or more steps of the method 300 of FIG. 3.

It is understood that parts of the method 300 and/or the semiconductor device 400 may be fabricated by complementary metal-oxide-semiconductor (CMOS) technology process flow, and thus some processes are only briefly described herein. Further, the semiconductor device 400 may include various other devices and features, such as additional transistors, bipolar junction transistors, resistors, capacitors, diodes, fuses, etc., but is simplified for a better understanding of the inventive concepts of the present disclosure. The semiconductor device 400 includes a plurality of semiconductor devices (e.g., transistors), which may be interconnected.

The device 400 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 300 begins at block 302 where a substrate is provided. The substrate has one or more fins extending from the substrate. Isolation regions (e.g., STI features) may interpose the fins. The substrate may be substantially similar to the substrate (including the fins and isolation regions) discussed above with reference to FIGS. 1 and/or 2.

Figure 4A:
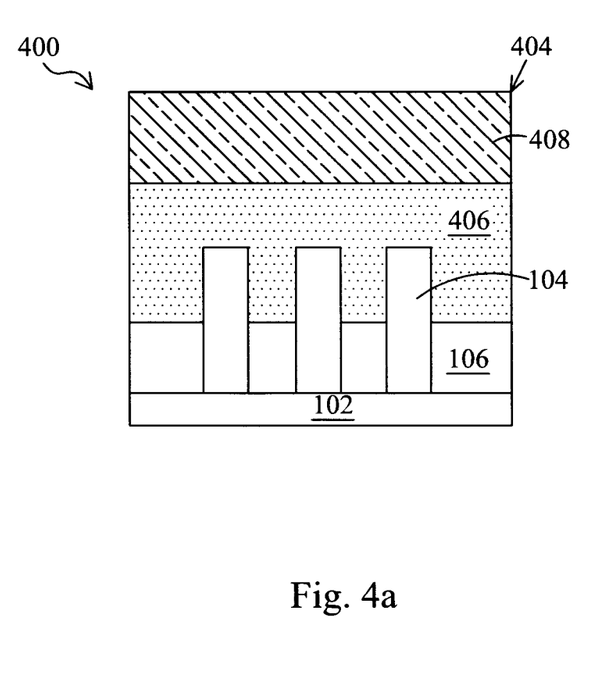
Figure 4B:
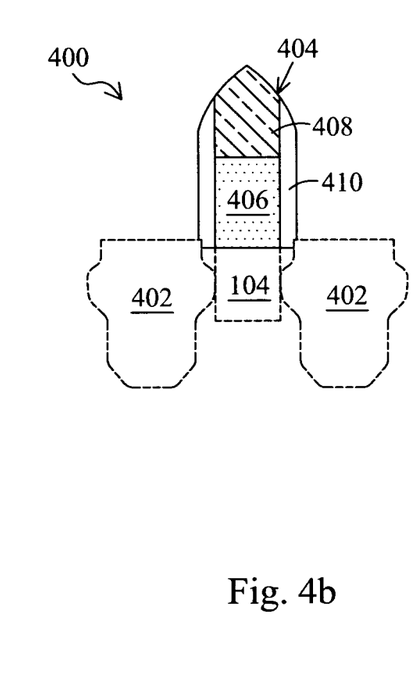

Referring to the example of FIGS. 4a/4b, a semiconductor device 400 is illustrated. The semiconductor device 400 includes a semiconductor substrate 102, a plurality of fins 104 extending from the substrate 102, and isolation regions 106. The isolation regions 106 are STI features. The semiconductor device 400 further includes source/drain regions 402 formed on/in the fin 104. In an embodiment, the source/drain regions 402 include epitaxially grown regions, for example, SiGe regions formed in a silicon fin 104. The source/drain regions 402 may be suitably doped to provide N-type or P-type regions. The source/drain regions 402 may be formed after the formation of the dummy gate structures, discussed below with reference to block 304.

The method 300 then proceeds to block 304 where a dummy gate structure is formed on one or more of the fins. The dummy gate structure includes one or more sacrificial layers, which are subsequently removed from the substrate as discussed before with reference to block 308. The dummy gate structures may include polysilicon, amorphous silicon, and/or other suitable material. The dummy gate structure may include layers that are not removed from the substrate, for example, gate dielectric layers, work function layers, interfacial layers, and/or other suitable layers. In other embodiments, the initially formed gate dielectric layer (e.g., $SiO_2$) formed with the dummy gate structure is sacrificial and subsequently replaced with a final gate dielectric.

The polysilicon layer of the dummy gate structure may be formed by suitable deposition processes such as, for example, low-pressure chemical vapor deposition (LPCVD) and plasma-enhanced CVD (PECVD). In an embodiment, a hard mask layer is disposed on the gate structures. Exemplary hard mask compositions include silicon nitride, oxide, and/or other suitable compositions.

Referring to the example of FIGS. 4a/4b, a dummy gate structure 404 is disposed on the fins 104. The dummy gate structure 404 includes a dummy layer 406. In an embodiment, the dummy layer 406 is polysilicon. A hard mask layer 408 is disposed on the dummy layer 406. Spacer elements 410 abut the sidewalls of the dummy gate structure 404.

The spacer elements 410 may be formed abutting the sidewalls of the gate structures prior to or after the formation of the source/drain regions (or portions thereof). The spacer elements 410 may be formed by depositing a dielectric material followed by an isotropic etching process, however other embodiments are possible. In an embodiment, the spacer elements 410 include silicon oxide, silicon nitride, and/or other suitable dielectrics. The spacer elements 410 may include a plurality of layers such as main spacer walls, liner layers, and the like.

Figure 5A:
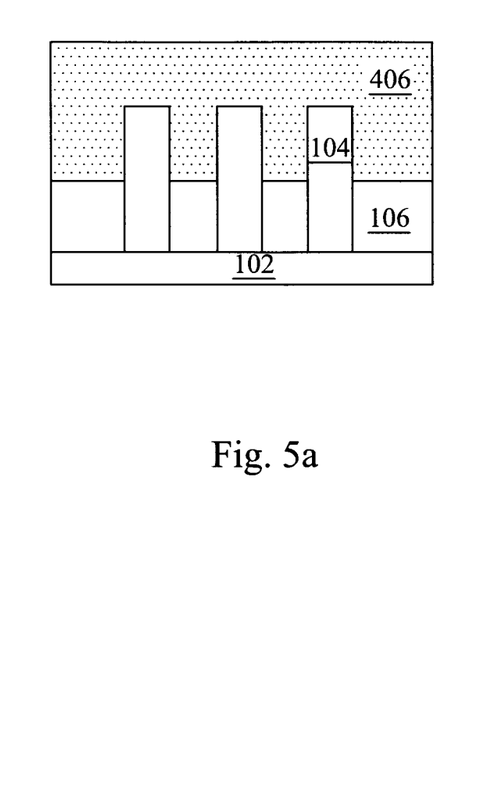
Figure 5B:
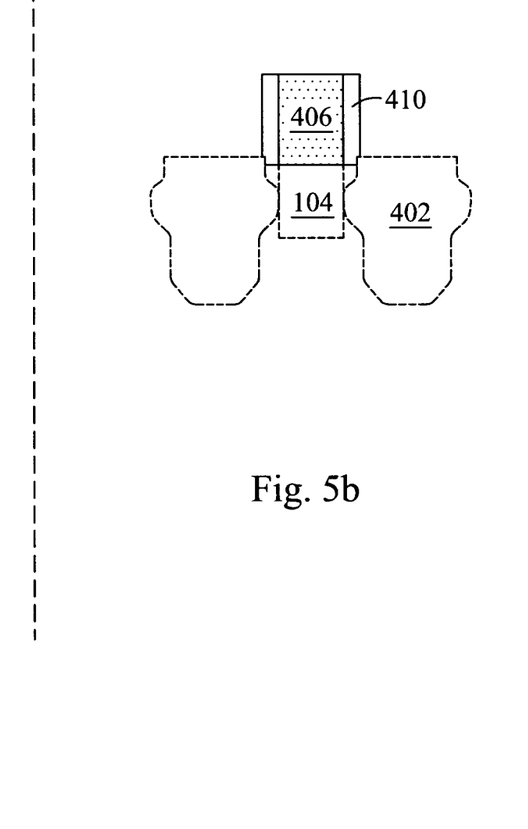

In embodiments, a hard mask layer formed on the dummy gate structure (e.g., for patterning purposes) may be subsequently removed. Referring to the example of FIG. 5, the hard mask layer 408 has been removed from the substrate. The hard mask layer may be removed using suitable wet or dry etching techniques.

Figure 6A:
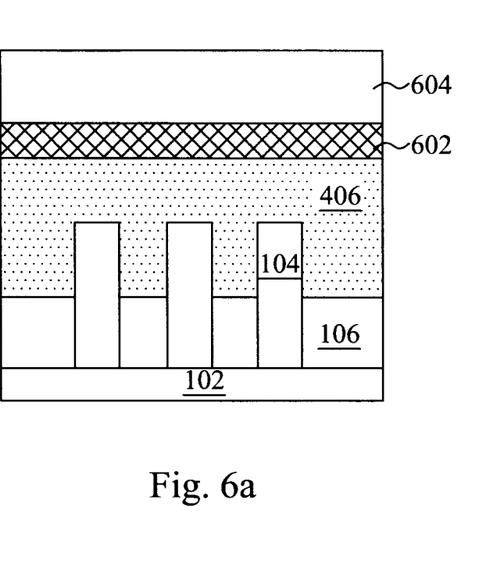
Figure 6B:
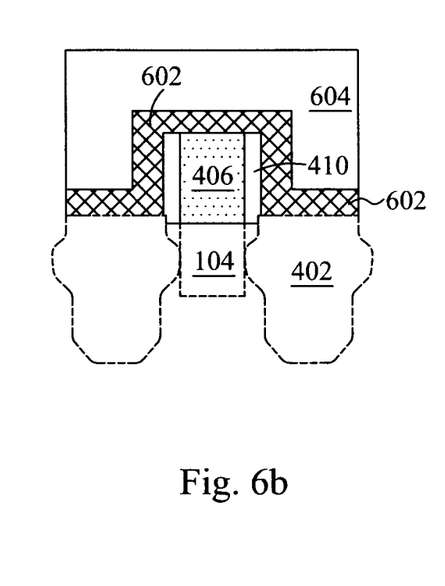

The method 300 then proceeds to block 306 where dielectric layers are formed on the substrate around the dummy gate structure. The dielectric layers may include a contact etch stop layer (CESL) and/or an inter-layer dielectric (ILD) layer. Examples of materials that may be used to form the CESL include silicon nitride, silicon oxide, silicon oxynitride, and/or other materials known in the art. The CESL may be formed by plasma-enhanced chemical vapor deposition (PECVD) process and/or other suitable deposition or oxidation processes. The ILD layer may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique. Referring to the example of FIGS. 6a/6b, a CESL 602 and an ILD layer 604 are formed on the substrate 102.

Figure 7A:
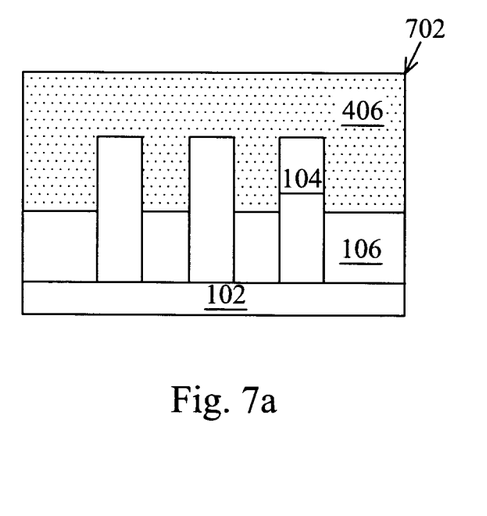
Figure 7B:
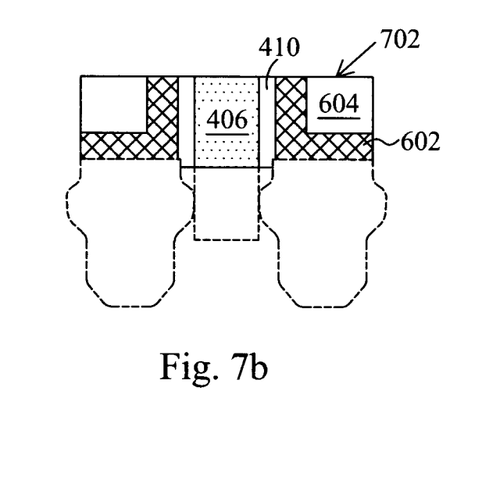

After forming the CESL and/or ILD layers, a planarization process is performed to expose a top surface of a gate structure, for example, removing portions of the CESL and ILD layers overlying the dummy gate structure. The planarization process may include a chemical mechanical planarization (CMP). Referring to the example of FIGS. 7a/7b, a planarization process has been performed to form surface 702 and expose the dummy layer 406 (e.g., polysilicon) of the gate structures 404.

The method 300 then proceeds to block 308 where a dummy gate structure, or portion thereof, is removed from the substrate. The removal of the dummy gate structure, or portion thereof, may result in a trench. A gate structure (e.g., metal gate structure) may be subsequently formed in the trench. The removal of the dummy gate structure may include a selective etch process such as a wet etch.

Figure 8A:
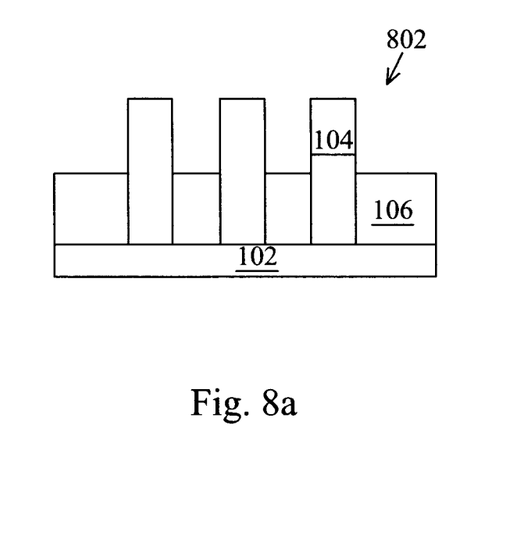
Figure 8B:
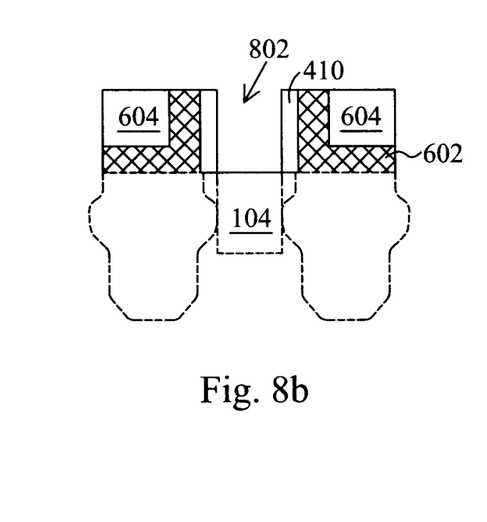

Referring to the example of FIGS. 8a/8b, the dummy layer 406 has been removed from the substrate 102 providing a trench 802. The trench 802 may define a region in which a metal gate structure can be formed, as described in further detail below.

As discussed above, in embodiments, an underlying gate dielectric, interfacial layer, and/or other suitable layer is also removed from the substrate when creating the trench. In other embodiments however, a quality gate dielectric layer is formed underlying a dummy layer (e.g., dummy layer 406) that remains on the substrate 102 underlying the to-be formed metal gate electrode layers.

The method 300 then proceeds to block 310 where a first metal layer of a gate structure is formed on the substrate. The first metal gate layer is formed in the trench provided by the removal of the dummy gate structure. The first metal gate layer may be a high stress metal. In other words, the first metal layer may have a composition selected to provide for a stress to the gate.

The first metal gate layer is fills the trench such that it is provided over the fin height, as it extends on and above a top surface of the fin. The fin may extend a height $H_{fin}$ above the isolation region. The $H_{fin}$ may be between approximately 10 nm and approximately 40 nm, by way of example. The first metal layer (e.g., stress metal) includes a height $H_{sm}$. $H_{sm}$ is greater than $H_{fin}$. The $H_{sm}$ may be between approximately 20 nm and approximately 70 nm, by way of example. The $H_{sm}$ may be less than $(H_{fin}+(H_{gate}/2))$. This relationship is described in further detail with respect to FIG. 2, the discussion of which is also applicable to the semiconductor device 400 and the method 300.

Exemplary compositions for the first metal gate layer include W, TiN, TaN, WN, Re, Ir, Ru, Mo, combinations thereof, and/or other suitable compositions. The first metal gate layer may be formed using chemical vapor deposition, atomic layer deposition, and/or other suitable process. In an embodiment, the first metal gate layer includes W having a Young's modulus of approximately 400-410 GPa, deposited, for example, by CVD. In an embodiment, the first metal gate layer includes TiN having a Young's modulus of approximately 251-550 GPa, deposited, for example, by atomic layer deposition (ALD). In an embodiment, the first metal gate layer includes TaN deposited by ALD. In an embodiment, the first metal layer includes WN deposited by CVD. In other embodiments, the first metal gate layer includes Re having a Young's modulus of approximately 463 GPa; Ir having a Young's modulus of approximately 528 GPa; Ru having a Young's modulus of approximately 447 GPa; or Mo having a Young's modulus of approximately 329 GPa.

A photosensitive layer (e.g., photoresist) may be formed on the first metal gate layer. The photoresist layer may serve to protect one or more regions of the first metal layer during subsequent processing.

Figure 9A:
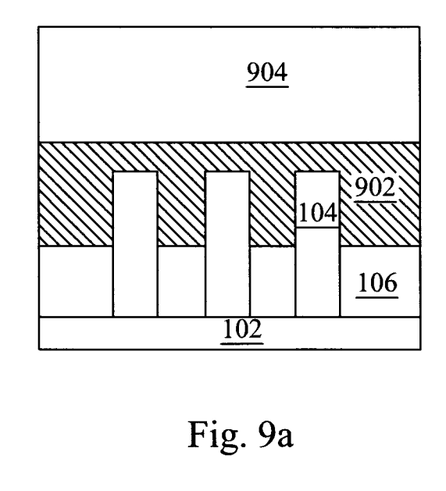
Figure 9B:
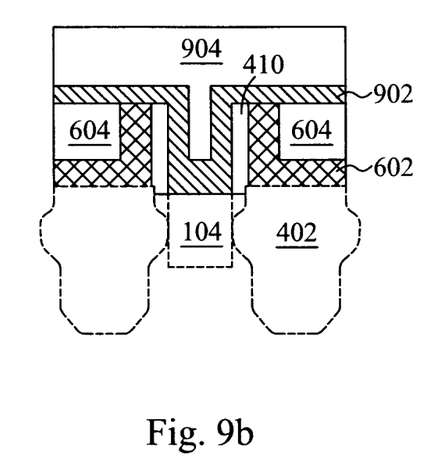
Figure 10A:
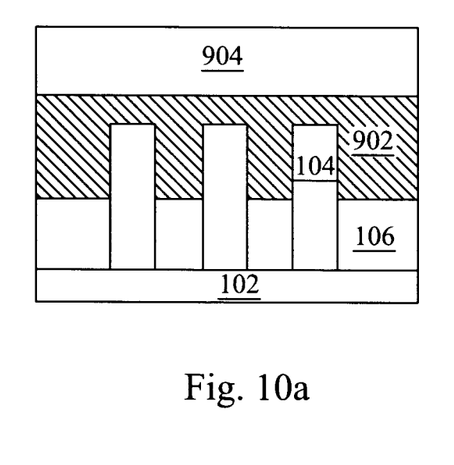
Figure 10B:
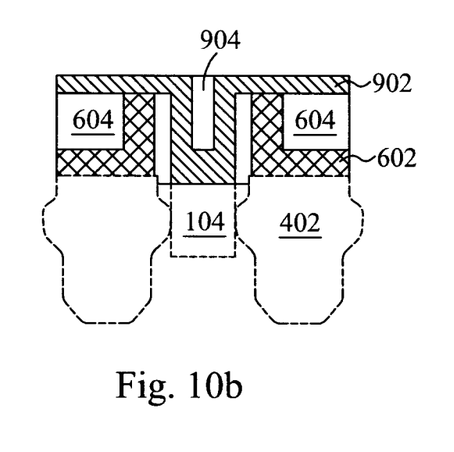

Referring to the example of FIGS. 9a/9b, a first metal layer (e.g., stress metal layer) 902 and a photoresist layer 904 are formed on the substrate. As described above, the first metal layer 902 has a height that extends above the fin 104. As such, the first metal layer 902 is disposed on the top surface of the fin 104.

The method 300 then proceeds to block 312 where a chemical mechanical polish (CMP) process is performed. The CMP process may remove a portion of the photosensitive material. For example, the CMP process may remove the photosensitive material overlying the first metal layer on the ILD regions of the substrate. The CMP may have an endpoint at the first metal layer. Referring to the example of FIGS. 10a/10b, a planarization process is performed that removes portions of the photoresist layer 904. See FIGS. 9a/9b. For example, the photoresist layer 904 overlying the ILD layer 604, the CESL 602, and the spacers 410 is removed by CMP. The photosensitive layer 904 remains filling the remainder of the trench 802. It is noted that in some embodiments no patterning by the way of photolithography is performed on the photosensitive layer.

Figure 11A:
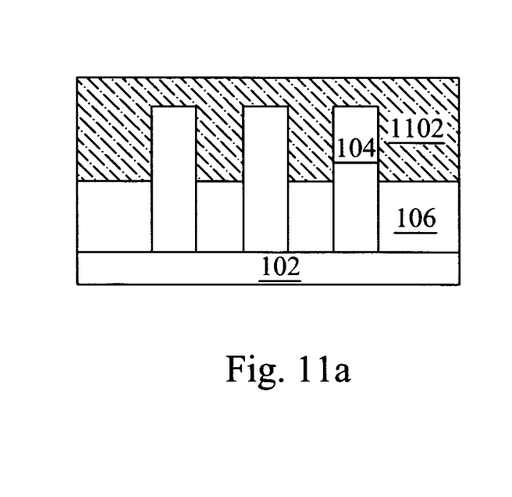
Figure 11B:
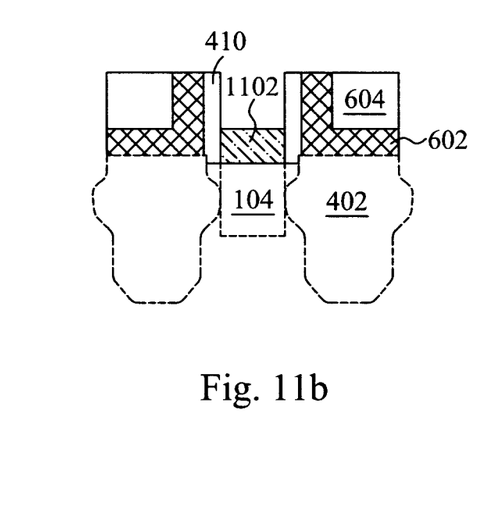

The method 300 then proceeds to block 314 where the first metal layer is etched. The metal layer may be etched using suitable dry etch, plasma etch, wet etch, and/or other suitable techniques. The remaining photosensitive layer may provide a masking element protecting portions of the first metal layer from the etching process. In an embodiment, the photosensitive layer provides a masking element such that the first metal layer is not removed from a bottom region of the trench. The photosensitive material may be stripped from the substrate, for example, after the metal etching. Referring to the example of FIGS. 11a/11b, an etched first metal layer 1102 is disposed on the substrate 102. The etched first meal layer 1102 is provided from processing the first metal layer 902.

The method 300 then proceeds to block 316 where a second metal layer of the gate structure is formed. The second metal layer may be formed directly on the first metal layer. The second metal layer may include a composition providing a conduction metal, e.g., providing a low resistance path. Exemplary compositions for the second metal layer include Al, Cu, CO, Ni, combinations thereof, and/or other suitable compositions. The second metal layer may be formed using physical vapor deposition, and/or other suitable process. In an embodiment, the second metal layer includes Al having a resistivity of $2.7E10^{-8}$ Ωm, deposited, for example, by physical vapor deposition (PVD). In an embodiment, the second metal layer includes Cu having a resistivity of $1.72*10^{-8}$ Ωm, deposited, for example, by PVD. In an embodiment, the second metal layer includes Co having a resistivity of $6*10^{-8}$ Ωm, deposited, for example, by PVD. In an embodiment, the second metal layer includes Ni having a resistivity of $7.2*10^{-8}$ Ωm, deposited, for example, by PVD.

Figure 12A:
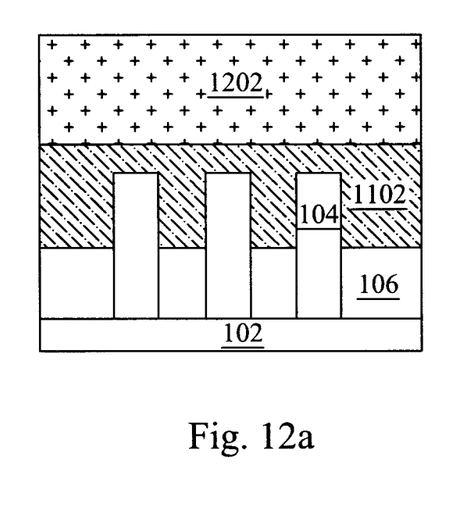
Figure 12B:
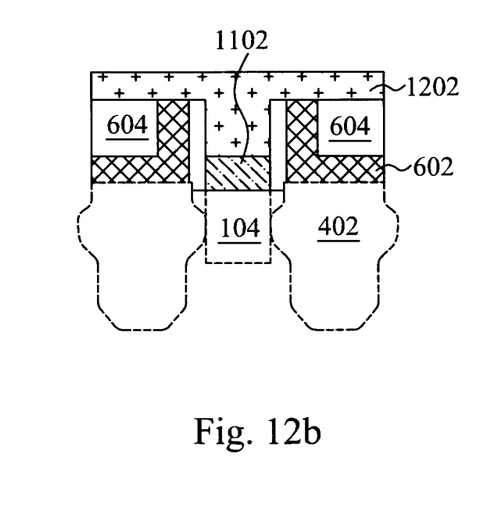

Referring to the example of FIGS. 12a/12b, a second metal layer (e.g., conduction metal layer) 1202 is formed on the substrate 102.

Figure 13A:
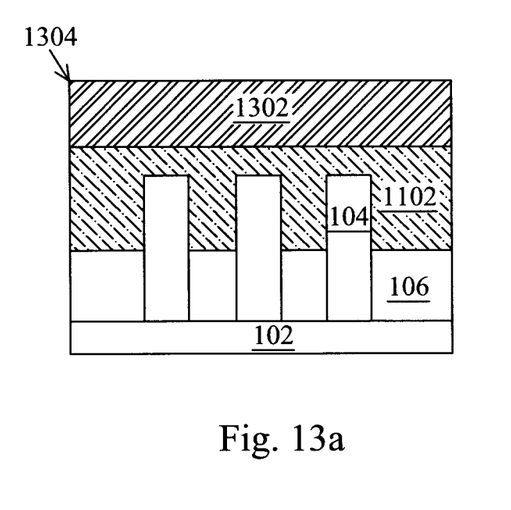
Figure 13B:
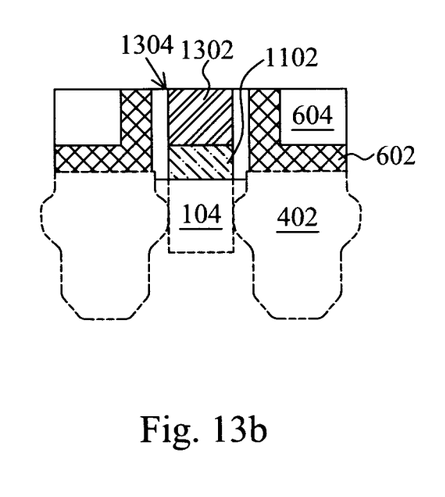

After forming the second metal layer, a chemical mechanical polishing (CMP) process may be performed to remove portions of the second metal layer (e.g., overlying the ILD, CESL regions). Referring to the example of FIGS. 13a/13b, the second metal layer 1202 has been planarized such that the planarized layer 1302 is provided. The second metal layer 1202 is removed from the CESL 620 and the ILD 604. The planarized layer 1302 remains filling the trench 802. Thus, a gate structure 1304 is provided. The gate structure 1304 may further include a gate dielectric layer, interfacial layer, and/or other suitable layer including as described above. In further processing a contact element may be formed coupled to the gate structure 1304.

The gate structure 1304 including the first metal layer 1102 and the second metal layer 1302 may have a gate height ($H_{gate}$) extending from a top surface of the gate structure (e.g., top of the second metal) to the top surface of the fin 104. The $H_{gate}$ may be between approximately 20 nanometers (nm) and approximately 60 nm, by way of example. The fin 104 may extend a height $H_{fin}$ above a top surface of the adjacent the isolation region. The $H_{fin}$ may be between approximately 10 nm and approximately 40 nm, by way of example. The second metal layer (e.g., conduction metal) 1302 may have a height $H_{cm}$.

More generally, the gate structure including the first and second metal layers described in blocks 310 and 316, respectively, may provide the relationship:

$$H_{fin} < H_{sm} < (H_{fin}+(H_{gate}/2))$$

or $H_{fin}$ may be less than $H_{sm}$ (height of the first metal); $H_{sm}$ (height of the first metal) is less than $H_{fin}$+half of $H_{gate}$. These dimensions are also illustrated in FIG. 2.

The resistance of the gate of the device (e.g., gate structure 1304) may be represented as $$R = 1/(L_g w) \lfloor \rho_{sm}(H_{sm}-H_{fin}) + \rho_{cm} + H_{cm} \rfloor$$

where $\rho_{sm} \gg \rho_{cm}$. $\rho_{sm}$ is the resistivity of the first metal layer 110. $\rho_{cm}$ is the resistivity of the second metal layer 1302. $L_g$ is the length of the gate.

The method 300 may continue to include further processes including those typical of a CMOS fabrication process. For example, the method 300 may include forming contacts to one or more elements of the device, multi-layer interconnect (MLI) structures, and the like.

In summary, the methods and devices disclosed herein provide, in certain embodiments, finFET devices having a high stress and low gate resistance. It is understood that different embodiments disclosed herein offer different disclosure, and that they may make various changes, substitutions and alterations herein without departing from the spirit and scope of the present disclosure.

What is claimed is:

1. A method, comprising:
providing a substrate having a fin extending therefrom, wherein a shallow trench isolation (STI) feature is disposed adjacent the fin and the fin extends a fin height above the STI feature; and
forming a metal gate structure on the fin, wherein the forming the metal gate structure includes:
forming a stress metal layer on the fin such that the stress metal layer extends to a first height above the STI feature, the first height being greater than the fin height, wherein the forming the stress metal layer includes:
depositing a stress metal on the substrate including in a trench;
forming a layer on the deposited stress metal including a first portion outside the trench and a second potion in the trench;
performing a polishing process to remove the first portion of the layer; and
etching the deposited stress metal using the second portion of the layer as a masking element; and
forming a conduction metal layer on the stress metal layer after etching the deposited stress metal.

2. The method of claim 1, wherein the stress metal layer is formed on a top surface of the fin, the top surface substantially parallel to a top surface of the substrate.

3. The method of claim 1, wherein the stress metal layer is formed directly on a gate dielectric layer.

4. The method of claim 1, wherein the stress metal layer and the conduction metal layer are formed in the trench provided by removing a dummy gate structure.

5. The method of claim 1, wherein the etching the deposited stress metal includes removing the stress metal disposed outside of the trench.

6. The method of claim 1, further comprising:
removing the second portion of the layer before forming the conduction metal layer.

7. The method of claim 1, wherein the stress metal layer includes a metal selected from the group consisting of W, TiN, TaN, WN, Re, Ir, Ru, Mo, and combinations thereof.

8. The method of claim 1, wherein the conduction metal layer includes a metal selected from the group consisting of Al, Cu, CO, Ni, and combinations thereof.

9. A method of fabricating a semiconductor device, comprising:
providing a substrate having a fin element and an isolation feature, wherein the fin element extends a height of $H_{fin}$ above a top surface of the isolation feature;
forming a metal gate structure in a trench provided by a removal of a dummy gate structure formed on the fin element, wherein the forming the metal gate structure includes:
forming a first metal layer in the trench, wherein the first metal layer has a height Hsm above the top surface of the isolation feature;
forming a photosensitive layer on the first metal layer;
performing a chemical mechanical polish (CMP) process to remove the photosensitive layer disposed outside of the trench and form a polished photosensitive layer disposed in the trench;
etching the first metal layer using the polished photosensitive layer as a masking element; and
forming a second metal layer in the trench on the etched first metal layer.

10. The method of claim 9, wherein the second metal layer has a thickness $H_{con}$ and wherein $H_{fin}<H_{sm}<(H_{fin}+(H_{gate}/2))$; wherein $H_{gate}$ is a sum of $H_{con}$ and $(H_{sm}-H_{fin})$.

11. The method of claim 9, further comprising:
forming the dummy gate structure including a dummy polysilicon layer on the fin; and
forming a dielectric layer adjacent the polysilicon layer; and
etching the polysilicon layer to form the trench.

12. The method of claim 9, wherein the etching the first metal layer using the polished photosensitive layer as a masking element includes removing the first metal layer from a region outside of the trench; and
after the etching, stripping the polished photosensitive layer prior to forming the second metal layer.

13. The method of claim 9, wherein the forming the first metal layer includes forming a conformal layer of a metal selected from the group consisting of W, TiN, TaN, WN, Re, Ir, Ru, Mo, and combinations thereof.

14. The method of claim 1, wherein the layer is a photosensitive layer.

15. A method of fabricating a finFET semiconductor device, comprising:
providing a substrate having a fin element, wherein the fin element extends a height of $H_{fin}$;
forming a trench on and around the fin element;
forming a gate dielectric layer in the trench;
forming a first metal layer in the trench on the gate dielectric layer, wherein the first metal layer has a height $H_{sm}$ above the top surface of the isolation feature, wherein the forming the first metal layer leaves an opening in the trench;
forming a protective layer on the first metal layer in the opening in the trench;
etching the first metal layer using the protective layer in the opening of the trench as a masking element; and
forming a second metal layer in the trench on the etched first metal layer, wherein the second metal has a thickness $H_{con}$.

16. The method of claim 15, wherein $H_{fin}<H_{sm}<(H_{fin}+(H_{gate}/2))$;
wherein $H_{gate}$ is a sum of $H_{con}$ and $(H_{sm}-H_{fin})$.

17. The method of claim 15, wherein the forming the protective layer includes depositing a photoresist layer.

18. The method of claim 17, wherein the forming the protective layer further includes:
depositing the photoresist layer in the opening in the trench and outside of the trench; and
performing a planarization process to remove the deposited photoresist layer from outside of the trench.

* * * * *